United States Patent [19]
Baliga

[11] Patent Number: 6,075,259
[45] Date of Patent: Jun. 13, 2000

[54] POWER SEMICONDUCTOR DEVICES THAT UTILIZE BURIED INSULATING REGIONS TO ACHIEVE HIGHER THAN PARALLEL-PLANE BREAKDOWN VOLTAGES

[75] Inventor: Bantval Jayant Baliga, Raleigh, N.C.

[73] Assignee: North Carolina State University, Raleigh, N.C.

[21] Appl. No.: 09/352,392

[22] Filed: Jul. 13, 1999

Related U.S. Application Data

[60] Continuation-in-part of application No. 08/940,410, Sep. 30, 1997, Pat. No. 5,950,076, which is a division of application No. 08/692,587, Aug. 6, 1996, Pat. No. 5,681,762, which is a division of application No. 08/337,977, Nov. 14, 1994, Pat. No. 5,543,637.

[51] Int. Cl.[7] .................................................. H01L 29/10
[52] U.S. Cl. .......................... 257/77; 257/607; 257/612
[58] Field of Search ........................... 257/77, 376, 590, 257/617, 607, 612, 139–145

[56] References Cited

U.S. PATENT DOCUMENTS

| | | | |
|---|---|---|---|
| 5,396,087 | 3/1995 | Baliga | 257/139 |
| 5,543,637 | 8/1996 | Baliga | 257/77 |
| 5,681,762 | 10/1997 | Baliga | 437/22 |
| 5,780,878 | 7/1998 | Bhatnagar et al. | 257/139 |
| 5,877,047 | 3/1999 | Wetizel et al. | 438/173 |
| 5,950,076 | 9/1999 | Baliga | 438/142 |

*Primary Examiner*—David Hardy
*Attorney, Agent, or Firm*—Myers Bigel Sibley & Sajovec

[57] ABSTRACT

Power semiconductor devices include a semiconductor substrate having a face thereon and a buried electrically insulating layer extending laterally in the semiconductor substrate and having an opening therein. A drift region of first conductivity type is also provided in the semiconductor substrate. To improve breakdown voltage characteristics, the drift region extends through the opening in the buried electrically insulating layer and has a first conductivity type doping concentration therein that is established at a level sufficient to generate a first conductivity type charge density of between $1 \times 10^{12}$ cm$^{-2}$ and $5 \times 10^{13}$ cm$^{-2}$ across the opening.

11 Claims, 4 Drawing Sheets

POWER SEMICONDUCTOR DEVICES THAT UTILIZE BURIED INSULATING REGIONS TO ACHIEVE HIGHER THAN PARALLEL-PLANE BREAKDOWN VOLTAGES

CROSS-REFERENCE TO RELATED APPLICATIONS

This application is a continuation-in-part (CIP) of U.S. application Ser. No. 940,410, filed Sep. 30, 1997, now U.S. Pat. No. 5,950,076, which is a divisional of U.S. application Ser. No. 692,587, filed Aug. 6, 1996, now U.S. Pat. No. 5,681,762, which is a divisional of U.S. application Ser. No. 337,977, filed Nov. 14, 1994, now U.S. Pat. No. 5,543,637, the disclosures of which are hereby incorporated herein by reference.

FIELD OF THE INVENTION

The present invention relates to semiconductor devices and more particularly to power semiconductor devices and methods of forming power semiconductor devices.

BACKGROUND OF THE INVENTION

As is well known to those having skill in the art, monocrystalline silicon carbide is particularly well suited for use in semiconductor devices, such as integrated circuit semiconductor devices and power semiconductor devices. Integrated circuit semiconductor devices typically include many active devices such as transistors in a single semiconductor substrate. Power semiconductor devices, which may be integrated circuit devices, are semiconductor devices which carry large currents and/or support high voltages.

Silicon carbide has a wide bandgap, a high melting point, a low dielectric constant, a high breakdown field strength, a high thermal conductivity and a high saturated electron drift velocity compared to silicon, which is the most commonly used semiconductor material. These characteristics allow silicon carbide microelectronic devices to operate at higher temperatures and higher power levels than conventional silicon based devices. In addition to the above advantages, silicon carbide power devices can operate with lower specific on-resistance than conventional silicon power devices. Some of the advantages of using silicon carbide for forming power semiconductor devices are described in articles by K. Shenai, R. S. Scott and inventor B. J. Baliga, entitled *Optimum Semiconductors for High-Power Electronics*, IEEE Transactions on Electron Devices, Vol. 36, No. 9, pp. 1811–1823 (1989); and by M. Bhatnagar and inventor B. J. Baliga entitled *Analysis of Silicon Carbide Power Device Performance*, ISPSD '91, Abstr. 8.3, pp 176–180 (1991).

In particular, semiconductor devices such as silicon carbide power MOSFETs have been considered attractive candidates for high power applications because the resistance of the MOSFET drift region is 200 times smaller than that for silicon devices with the same breakdown voltage. However, the operation of some silicon carbide power devices may require the formation of an inversion layer channel when turned on. This is unfortunate because the inversion layer mobility measured for electron inversion layers has been found to be relatively small (~15 cm$^2$ V$^{-1}$ sec$^{-1}$). This will result in a relatively large channel resistance which can degrade performance of the silicon carbide power device. Thus, notwithstanding the benefits of using silicon carbide as a semiconductor material, there continues to be a need for silicon carbide semiconductor devices which do not require the formation of inversion layer channels when turned on.

Examples of such devices are disclosed in U.S. Pat. No. 5,323,040, to Baliga, entitled *Silicon Carbide Field Effect Device*, and in U.S. Pat. No. 5,396,085, to Baliga, entitled *Silicon Carbide Switching Device with Rectifying Gate*, the disclosures of which are incorporated herein by reference. These devices may, however, require the formation of vertically walled trenches in silicon carbide and relatively high resolution lithographic steps during processing, which makes these devices difficult and/or expensive to produce.

Many of the methods for forming semiconductor devices also require the formation of insulating regions, such as oxides, that act as masks for device processing and perform the function of electrically isolating one or more regions of a semiconductor device as well as isolating adjacent devices on a semiconductor substrate. Conventional techniques for forming insulating regions on silicon include thermal oxidation, low pressure chemical vapor deposition (LPCVD) and plasma-assisted deposition. As will be understood by one skilled in the art, thermal oxidation is probably the most common technique used to grow high quality oxides, such as those made of $SiO_2$, on silicon substrates. SIMOX techniques have also been successfully used to form silicon SOI substrates.

Notwithstanding these attempts at growing insulating regions in silicon, however, similar techniques have not found substantial application in the formation of insulating regions in silicon carbide devices. This is particularly true with respect to the formation of relatively thick insulating regions. As will be understood by those skilled in the art, thick insulating regions are particularly important for silicon carbide power devices in order to inhibit leakage currents, electric arcing, or field oxide breakdown, when such devices are operated in the presence of high electric fields and/or at high current levels. Thus, there continues to be a need for methods of forming semiconductor devices having insulating regions therein that provide electrical isolation and inhibit leakage currents, and devices formed thereby.

SUMMARY OF THE INVENTION

It is therefore an object of the present invention to provide improved semiconductor devices which can be operated without requiring the formation of an inversion layer channel, and methods of fabricating same.

It is another object of the present invention to provide semiconductor devices for high power applications, and methods of fabricating same.

It is still another object of the present invention to provide semiconductor devices which are suitable for large scale integration on a semiconductor substrate, and methods of fabricating same.

It is a further object of the present invention to provide semiconductor devices which include insulating regions therein for providing electrical isolation, and methods of fabricating same.

These and other objects, advantages and features of the present invention are provided, according to the present invention, by a semiconductor device having a silicon carbide substrate, a semiconducting silicon carbide active layer in the substrate and a silicon carbide buried layer which provides a conduction barrier between the silicon carbide substrate and at least a portion of the silicon carbide active layer. According to one aspect of the present invention, the silicon carbide buried layer is formed by implanting second conductivity type dopants into a silicon carbide substrate of first conductivity type so that a P-N junction barrier is provided between the silicon carbide active layer and the substrate. This barrier can then be used in the formation of power semiconductor devices which have both lateral and vertical active regions and which can be operated without the formation of an inversion layer. According to another aspect of the present invention, the silicon carbide buried layer is formed by implanting electrically inactive ions into the silicon carbide substrate so that a relatively high resistance barrier is provided between the silicon carbide active layer and the substrate. The electrically inactive ions are preferably selected from the group consisting of argon, neon, carbon and silicon, although other ions which are electrically inactive in silicon carbide may be used. This high resistance barrier can then be used to provide electrical isolation to a semiconductor device and perform other insulating functions.

In particular, one embodiment of a semiconductor device according to the present invention includes a silicon carbide buried layer which is formed by implanting electrically inactive ions into a silicon carbide substrate of first conductivity type so that the buried layer contains both first conductivity type dopants and the implanted electrically inactive ions therein. The implantation step is designed to cause the formation of a large number of electrically active deep level defects in the buried layer, particularly near the peak of the implant profile which is Gaussian in shape. These electrically active defects are caused by the presence of the implanted electrically inactive ions at interstitial locations of the silicon carbide lattice. Moreover, the presence of ions such as neon or argon at substitutional locations in the silicon carbide lattice will also result in the formation of electrically active defects. To obtain a preferred number of electrically active defects, the inactive ions can be implanted at sufficiently high energies and doses. Such defects would typically be avoided in the design of conventional semiconductor devices, however, the present invention utilizes these defects to achieve desired performance characteristics. This is because the defects are used to compensate for the first conductivity type dopants in the implanted region.

These compensation effects cause the extrinsic Fermi level ($\epsilon_{fe}$) in the implanted region to move towards its intrinsic Fermi level ($\epsilon_{fi}$). The implanted region therefore acquires electrical characteristics that are similar to intrinsic silicon carbide. Intrinsic silicon carbide can be used as a high resistance conduction barrier because of the relatively large bandgap between silicon carbide's intrinsic Fermi level ($\epsilon_{fi}$) and its conduction or valence band edge ($E_c$, $E_v$). For example, the resistivity of intrinsic silicon carbide has been estimated to be $7 \times 10^9$, $5 \times 10^{14}$ and $2 \times 10^{16}$ Ohm-cm for 3C—SiC, 6H—SiC and 4H—SiC polytypes, respectively. The compensation effects caused by the implantation of electrically inactive ions can also be advantageously used to form a silicon carbide-on-insulator substrate having a buried electrically insulating layer. This buried layer also has electrical properties similar to intrinsic silicon carbide. This aspect of the present invention would be difficult to achieve in conventional semiconductor materials such as silicon, germanium and gallium arsenide because these materials have relatively low resistivities as intrinsic semiconductors.

Another embodiment of a semiconductor device according to the present invention includes a silicon carbide substrate of first conductivity type, having first and second opposing faces, and a silicon carbide buried layer which has second conductivity type dopants therein and an opening therethrough. A silicon carbide active layer of first conductivity type, which has relatively few second conductivity type dopants therein, is also provided between the buried layer and the first face of the substrate. The silicon carbide active layer can also have a first conductivity type doping concentration greater than that of the substrate. A substrate connecting region of first conductivity type is also provided in the opening so that charge carriers in the active layer can be transferred to the substrate and vice versa. According to this embodiment, the silicon carbide buried layer is compensated by the implanted second conductivity type dopants and the silicon carbide active layer is also compensated by the second conductivity type dopants, although to a significantly lesser extent. The compensation in the silicon carbide active layer is sufficient, however, so that the magnitude of the difference in energy between the Fermi level of the silicon carbide active layer and the Fermi level of intrinsic silicon carbide is less than the magnitude of the difference in energy between the Fermi level of the substrate connecting region and the Fermi level of intrinsic silicon carbide, even though both the active layer and the substrate connecting region are of the same net conductivity type. This embodiment can also include electrically inactive ions in place of the second conductivity type ions.

These aspects of the present invention can be utilized in the formation of a variety of silicon carbide semiconductor devices such as lateral field effect devices and devices having both vertical and lateral active regions which are designed for high power applications. In particular, lateral silicon carbide-on-insulator enhancement and depletion mode field effect transistors (FETs) can be formed in accordance with the present invention. Vertical silicon carbide power MESFET devices can also be formed by incorporating a silicon carbide source region adjacent the first face and a drain region adjacent the second face, and by providing a Schottky barrier gate electrode on the first face, above the substrate connecting region. This vertical MESFET can also be operated without requiring the formation of an inversion layer channel. It will be appreciated by those skilled in the art that other semiconductor devices can also incorporate the above described preferred aspects of the present invention.

Accordingly, the silicon carbide devices according to the present invention include a buried silicon carbide conduction barrier layer which provides electrical isolation between one or more regions of a device or between adjacent devices in a substrate. The buried layer can be formed by implanting electrically inactive ions or by implanting electrically active ions which are of opposite conductivity type relative to the substrate. The buried layer can then be patterned so that the silicon carbide device does not require the formation of an inversion layer channel when turned on. The buried layer can also be used to isolate a device from an underlying silicon carbide substrate. The methods for forming the silicon carbide devices according to the present invention also do not require vertical processing or high resolution lithography steps, which makes the methods suitable for large scale processing.

Additional semiconductor switching devices according to the present invention may also include a semiconductor substrate having a face thereon and a buried electrically insulating layer (e.g., oxide layer) extending laterally in the semiconductor substrate and having an opening therein. A drift region of first conductivity type is also provided in the semiconductor substrate. To improve breakdown voltage characteristics, the drift region extends through the opening in the buried electrically insulating layer and has a first conductivity type doping concentration therein that is established at a level sufficient to generate a first conductivity type charge density of between $1 \times 10^{12}$ cm$^{-2}$ and $5 \times 10^{13}$ cm$^{-2}$ across the opening. If the switching device is a MOSFET, base and source regions of second and first conductivity type, respectively, are also provided. The base region is disposed between the buried electrically insulating layer and the face, and forms a P-N rectifying junction with the drift region. The source region is provided in the base region and forms a P-N rectifying junction therewith. If the switching device is Schottky rectifier, then a Schottky rectifying contact is formed with a portion of the drift region extending opposite the buried electrically insulating layer.

DESCRIPTION OF PREFERRED EMBODIMENTS

Figure 1A:
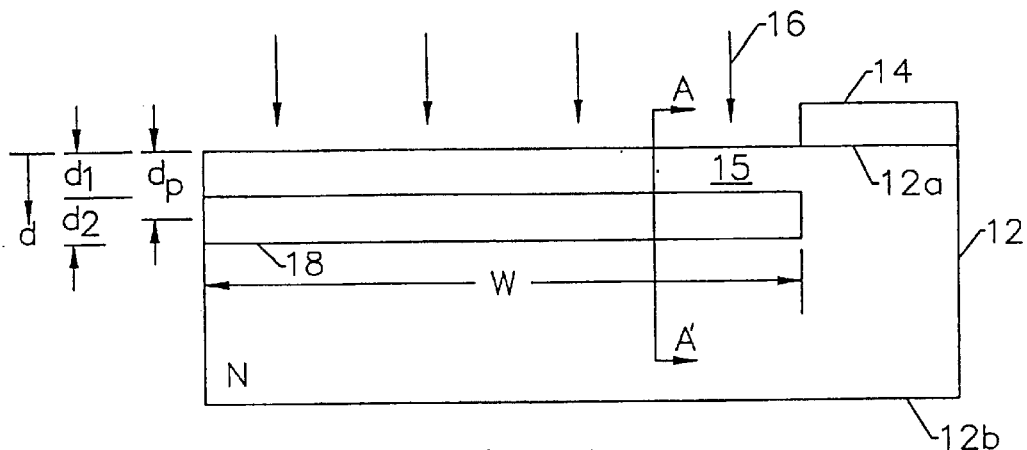
FIGS. 1a–c are cross-sectional views of intermediate structures which illustrate a method of forming a silicon carbide semiconductor device unit cell according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout. Moreover, the terms "first conductivity type" and "second conductivity type" refer to opposite conductivity type such as P or N-type, however, each embodiment described and illustrated herein includes its complementary embodiment as well.

Figure 1B:
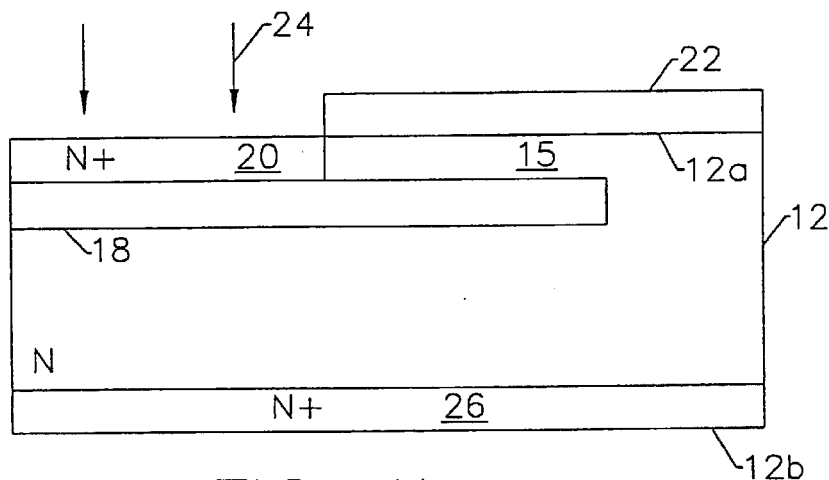
Figure 1C:
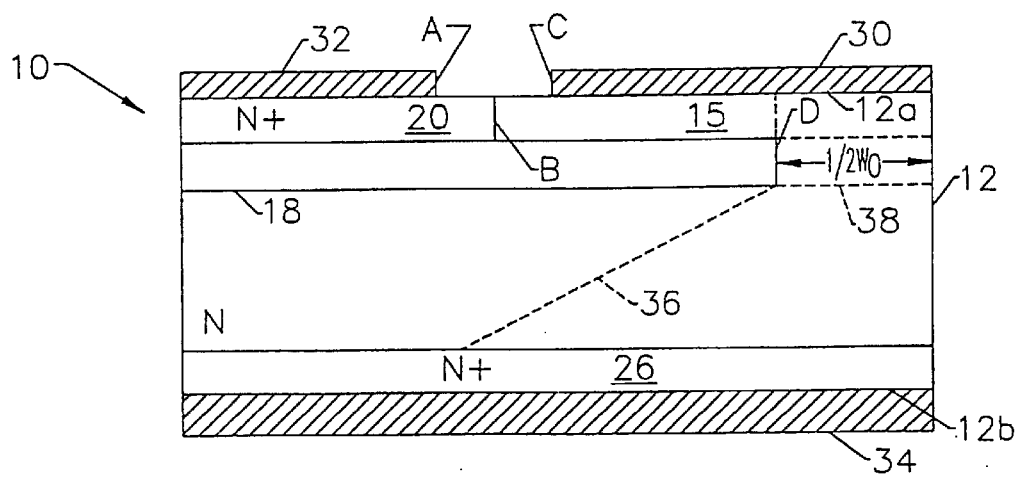

Referring now to FIGS. 1a–c, a method of forming a silicon carbide semiconductor device unit cell according to the present invention will be described. The method begins with the steps of providing a silicon carbide substrate 12 of first conductivity type (shown as N) having first and second opposing faces 12a–b and then patterning a photoresist masking layer 14 on the first face 12a to expose a portion thereof. This is then followed by the step of implanting ions 16 into the exposed portion of the face 12a so that a silicon carbide buried layer 18 containing the implanted ions is formed. The silicon carbide buried layer 18 also contains the background first conductivity type dopants of the substrate. These ions 16 can be electrically inactive ions. Such inactive ions may be selected from the group consisting of argon, neon, carbon and silicon, however, inactive versions of ions that can be activated in silicon carbide may also be included as "inactive" ions. These ions 16 can also be electrically active ions of second conductivity type such as those selected from the group consisting of boron and aluminum as P-type dopants or nitrogen as an N-type dopant, for example. Relatively thick buried layers can also be formed by performing multiple implant steps with the same or different ions at the same or different energies and dose levels. The dose levels can also be sufficiently high to produce an amorphous silicon carbide buried layer 18.

Because the width ("W") of the buried layer 18 will be large compared to the depth of the implanted ions 16, the distribution of the implanted ions 16 in the substrate 12, taken along line A-A', can be approximated as a one-dimensional Gaussian distribution of the form:

$$I(d) = \frac{D_o}{\sqrt{2\pi}\,\Delta d_p}\exp\left[-\frac{1}{2}\left(\frac{d - d_p}{\Delta d_p}\right)^2\right] \quad (1)$$

where $I(d)$ ($cm^{-3}$) is the concentration of implanted ions 16. As illustrated by Equation (1), $I(d)$ is a function of the distance "d" from the first face 12a, the implant dose "$D_o$" ($cm^{-2}$), the depth of the peak of the implant distribution "$d_P$" and the standard deviation of the implant distribution "$\Delta d_P$". Table 1 below illustrates preferred implant parameters for the above described electrically active and inactive ions in 6H—SiC. As will be understood by those skilled in the art, the peak of the implant distribution $d_P$ is a function of, among other things, the ion implant energy "E", the implant angle "∠" relative to the face 12a and the crystallographic structure of the substrate 12 (e.g., 3C—SiC, 6H—SiC and 4H—SiC).

The implantation of the ions 16 also defines a semiconducting active layer 15 between the buried layer 18 and the first face 12a. The active layer 15 contains first conductivity type dopants and a relatively small percentage of the implanted ions 16 therein which are included in the "tail" of the implant distribution. Accordingly, the width of the buried layer "$d_2$" equals two times the difference between the depth of the peak of the implant distribution $d_P$ and the thickness of the active layer 15 "$d_1$" (i.e., $d_2=2(d_P-d_1)$). As defined herein, $d_1$ is the distance "d" at which $I(d)$ equals the doping concentration of the substrate ($N_d$ or $N_a$), for $d<d_P$. Thus, the concentration of the implanted ions 16 in the active layer 15 can be significantly below the peak concentration of implanted ions 16 in the buried layer 18, so that the active layer 15 is not significantly compensated by the implanted ions 16. Moreover, the thickness of the active layer 15 ($d_1$) can be optimally chosen for a particular device application by adjusting the dose and energy of the implanted ions 16.

In the case of the electrically inactive ions, the implantation step is designed to cause the formation of a large number of electrically active deep level defects in the buried layer. These electrically active defects are typically caused by the presence of the implanted electrically inactive ions at interstitial locations of the silicon carbide lattice. Moreover, the presence of ions such as neon or argon at substitutional locations in the silicon carbide lattice will also result in the formation of electrically active defects. To obtain a preferred number of electrically active defects, the inactive ions can be implanted at sufficiently high energies and doses. Such defects would typically be avoided in the design of conventional semiconductor devices, however, the present invention utilizes these defects to achieve desired performance characteristics. This is because the defects are used to compensate for the first conductivity type dopants in the implanted region.

These compensation effects cause the extrinsic Fermi level ($\epsilon_{fe}$) in the implanted region to move towards its intrinsic Fermi level ($\epsilon_{fi}$). The implanted region therefore acquires electrical characteristics that are similar to intrinsic silicon carbide. Intrinsic silicon carbide can be used as a high resistance conduction barrier because of the relatively large bandgap between silicon carbide's intrinsic Fermi level ($\epsilon_{fi}$) and its conduction or valence band edge ($E_c$, $E_v$). For example, the resistivity of intrinsic silicon carbide has been estimated to be $7\times10^9$, $5\times10^{14}$ and $2\times10^{16}$ Ohm-cm for 3C—SiC, 6H—SiC and 4H—SiC polytypes, respectively. This aspect of the present invention would be difficult to achieve in conventional semiconductor materials such as silicon, germanium and gallium arsenide because these materials have relatively low resistivities as intrinsic semiconductors.

According to a preferred aspect of the present invention, the dose of the implanted electrically inactive ions 16 is chosen so that the magnitude of the difference in energy between the Fermi level of the silicon carbide buried layer 18 and the Fermi level of intrinsic silicon carbide ($\epsilon_{fi}$) is less than the magnitude of the difference in energy between the Fermi level of the silicon carbide substrate 15 and the Fermi level of intrinsic silicon carbide. The dose level can also be chosen so that the buried layer 18 is an electrically insulating layer having a resistivity greater than $10^9$ Ohm-cm. Similarly, the silicon carbide active layer 15 also contains the electrically inactive ions 16 in sufficient quantity so that the magnitude of the difference in energy between the Fermi level of the silicon carbide active layer 15 and the Fermi level of intrinsic silicon carbide is less than the magnitude of the difference in energy between the Fermi level of the silicon carbide substrate 12 and the Fermi level of intrinsic silicon carbide.

TABLE 1

| ION | $D_0$ (cm$^{-2}$) | $\angle$ | ENERGY (keV) | $d_p$ ($\mu$m) | $\Delta d_p$ ($\mu$m) | I ($d_p$) (cm$^{-3}$) | $d_1$ ($\mu$m) | $d_2$ ($\mu$m) |
|---|---|---|---|---|---|---|---|---|
| Ar | $7 \times 10^{13}$ | 9° | 400 | 0.29 | 0.07 | $4 \times 10^{18}$ | 0.10 | 0.43 |
| Ne | $3 \times 10^{14}$ | 9° | 400 | 0.49 | 0.09 | $1 \times 10^{19}$ | 0.16 | 0.60 |
| C | $1.2 \times 10^{15}$ | 9° | 400 | 0.70 | 0.10 | $7 \times 10^{19}$ | 0.31 | 0.74 |
| Si | $1.3 \times 10^{14}$ | 9° | 400 | 0.36 | 0.08 | $8 \times 10^{18}$ | 0.08 | 0.50 |
| B | $1.8 \times 10^{15}$ | 9° | 400 | 0.81 | 0.1 | $9 \times 10^{19}$ | 0.35 | 0.8 |
| Al | $1.6 \times 10^{14}$ | 9° | 400 | 0.39 | 0.08 | $1 \times 10^{19}$ | 0.08 | 0.55 |
| N | $8 \times 10^{14}$ | 9° | 400 | 0.63 | 0.09 | $7 \times 10^{19}$ | 0.25 | 0.8 |

Referring now to FIG. 1b, a second photoresist masking layer 22 is then patterned on the first face 12a to expose a second portion thereof. A relatively highly doped region of first conductivity type 20 (shown as N+) is then formed in the substrate 12, by implanting a first conductivity type dopant 24 at the first face 12a. As will be understood by those skilled in the art, a blanket implant of the first conductivity type dopant can also be performed at the second face 12b to form a second relatively highly doped region 26 (shown as N+). Alternatively, the silicon carbide substrate 12 can be formed by epitaxially growing an N-type layer on top of an N+ layer 26.

Referring now to FIG. 1c, first and second electrically conductive ohmic contacts 32, 34 are then formed on the first and second relatively highly doped regions 20, 26, respectively. A rectifying Schottky gate contact 30 can also be formed on the first face 12a, as illustrated, so that the semiconductor device unit cell comprises a metal-epitaxial-semiconductor field effect transistor (MESFET) 10 having a source 20, a lateral active region 15, a vertical active region 36 or drift region which extends between the Schottky gate contact 30 and the second face 12b, and a relatively highly doped drain 26.

This MESFET 10 is a planar device which does not have a P-N junction in the current path, between the source and drain regions 20, 26. The forward blocking capability is achieved by the formation of a potential barrier between the source and drain regions. This can be done by depletion of a thin silicon carbide active layer, between the Schottky gate contact 30 and the buried layer 18 either by the built-in potential or by the application of a negative gate bias. A large drain voltage can be supported by this structure because the drift region below the buried layer and the Schottky gate contact 30 becomes depleted. This drift region supports most of the drain bias. The MESFET 10 also has a flyback diode between the Schottky gate contact 30 and the drain 26, which can be used with a silicon MOSFET (not shown) in series with the source. This and other applications of the present invention are described in the aforementioned '085 patent to Baliga. The MESFET 10 also has high breakdown voltage because the buried layer 18 can act as a guard ring for the Schottky gate contact 30. This reduces the electric field under the Schottky contact and prevents barrier lowering.

Figure 2:
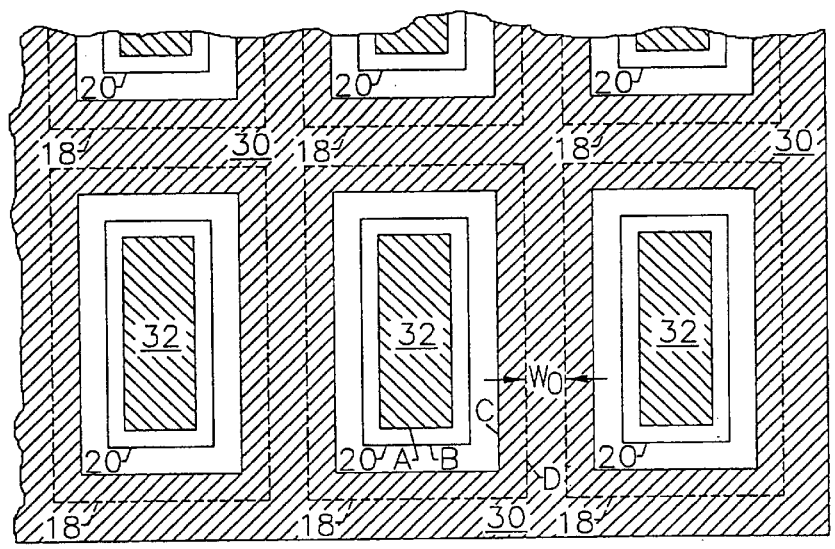
FIG. 2 illustrates a layout of a vertical MESFET integrated circuit according to the present invention.

It will also be understood by those skilled in the art that multiple unit cells of the MESFET 10 of FIG. 1c can be electrically connected in parallel and integrated on a common silicon carbide substrate so that arrays of cells can be paralleled for high current applications. For example, FIG. 2 illustrates a preferred layout of an integrated embodiment of the MESFET 10 of FIG. 1c, wherein the labeled regions A, B, C and D define the lateral extent of the first ohmic contact 32 (source contact), first relatively highly doped region 20 (source), Schottky barrier gate contact 30 and buried layer 18, respectively. The distance "$W_o$" between adjacent buried layers 18 also defines a substrate connecting region 38 of first conductivity type which connects the active layer 15 to the substrate. Thus, electrical carriers in the active region 15 can be transferred to the substrate 12 and vice versa without having to traverse the buried layer 18. Because the adjacent buried layers 18 are preferably formed simultaneously, they can be treated as a single buried layer having openings therein of width $W_o$. To enhance the breakdown characteristics of the device 10 even further, the majority carrier doping concentration in the substrate connecting region 38 is preferably set at a level to generate a first conductivity type charge density of between $1\times10^{12}$ cm$^{-2}$ and $5\times10^{13}$ cm$^{-2}$ therein, as measured in a lateral direction across the substrate connecting region 38.

Figure 3A:
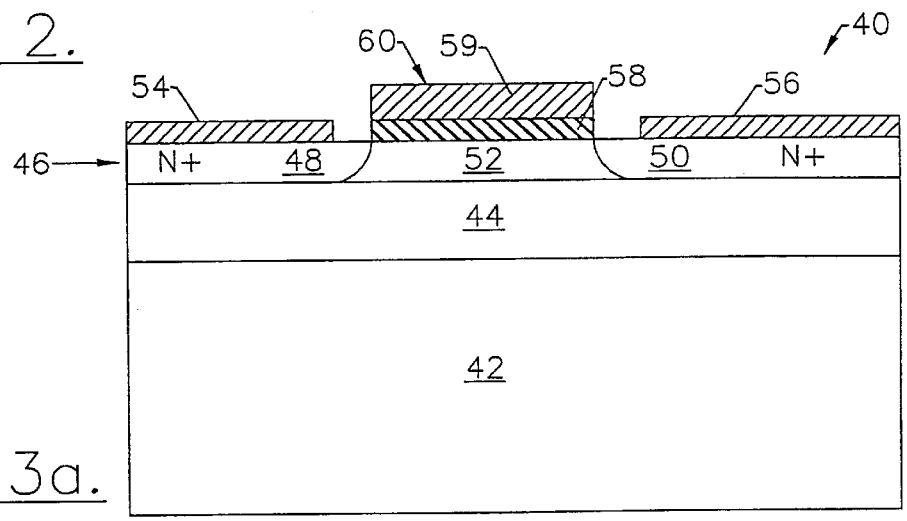
FIG. 3a illustrates a silicon carbide-on-insulator metal-oxide-semiconductor field effect transistor (MOSFET) according to the present invention.

Referring now to FIG. 3a, the structure of a lateral silicon carbide-on-insulator metal-oxide-semiconductor field effect transistor (MOSFET) 40, according to the present invention, will be described. The MOSFET 40 preferably comprises a monocrystalline silicon carbide layer 42 and an electrically insulating silicon carbide layer 44 on the monocrystalline silicon carbide layer 42. The electrically insulating silicon carbide layer 44 is preferably formed by performing one or more blanket or selectively masked implants of electrically inactive ions so that a relatively high resistance insulating layer is formed in the substrate beneath the face. The resistance is sufficient to provided a high degree of electrical isolation from the substrate. As described above, the electrically inactive ions are preferably selected from the group consisting of argon, neon, carbon and silicon. The MOSFET 40 also includes a semiconducting silicon carbide active layer 46 on the electrically insulating silicon carbide layer 44. This active layer 46 can include source 48, drain 50 and channel regions 52 for an enhancement mode or depletion mode field effect transistor. Source and drain ohmic contacts 54 and 56 are also formed on the respective source and drain regions 48 and 50. An insulated gate electrode 60 is also preferably provided by an electrically insulating layer 58 and a conductive gate electrode 59 thereon.

Figure 3B:
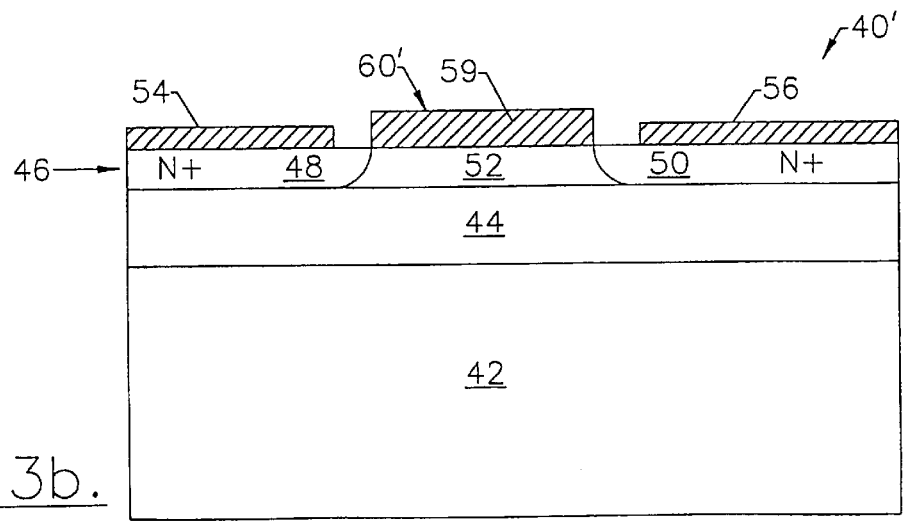
FIG. 3b illustrates a silicon carbide-on-insulator metal-epitaxial-semiconductor field effect transistor (MESFET) according to the present invention.

Referring now to FIG. 3b, the structure of a lateral silicon carbide-on-insulator MESFET 40', according to the present invention, is illustrated. This MESFET 40' is similar to the MOSFET 40 of FIG. 3a, however, the insulated gate electrode 60 has been replaced with a Schottky barrier gate electrode 60' on the channel region 52.

Figure 4A:
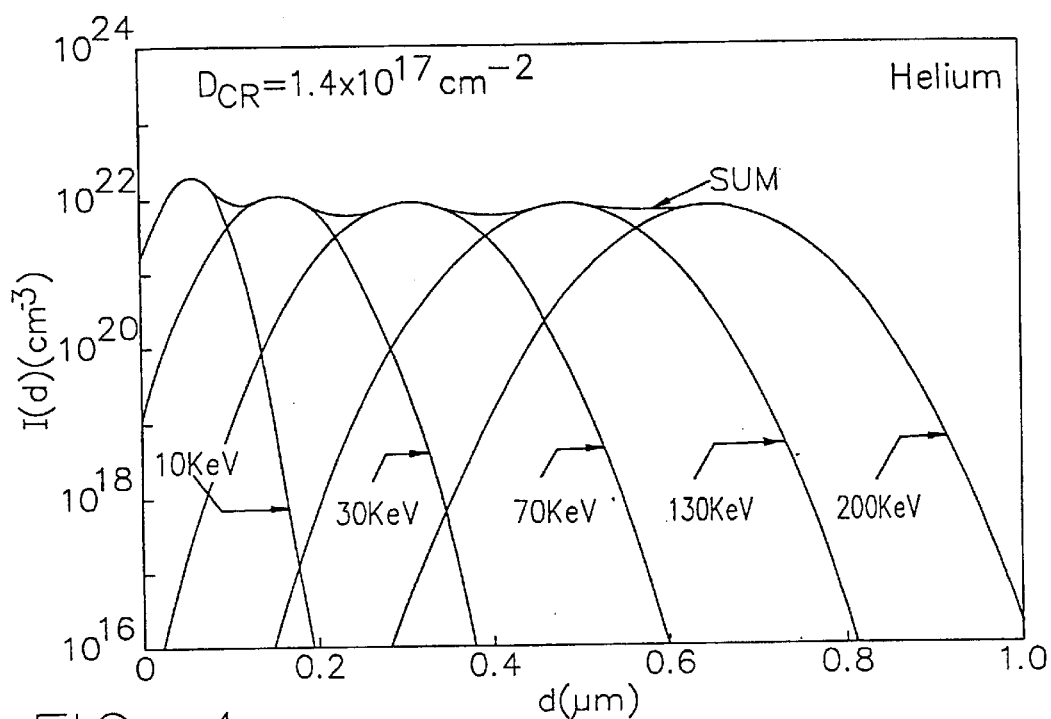
FIGS. 4a–b illustrate implant distribution profiles for helium (He) and carbon (C) in a silicon carbide substrate, respectively.
Figure 4B:
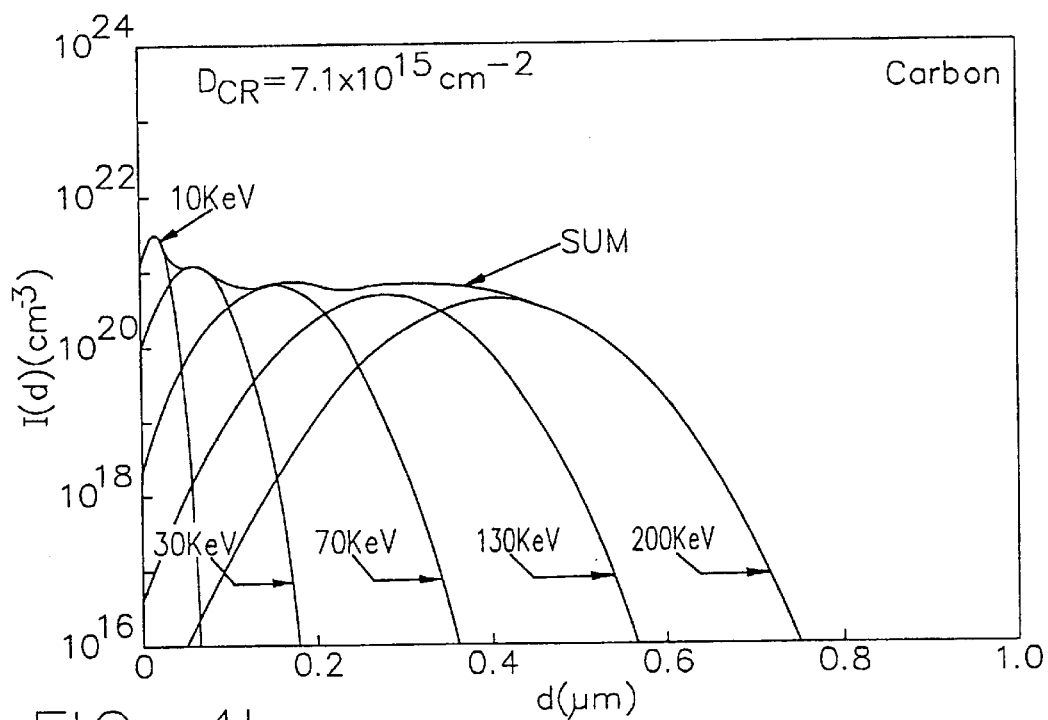

In order to form a relatively thick electrically insulating silicon carbide layer 44, multiple implant steps can also be performed in sequence by varying, among other things, the implant energy of the electrically inactive ions and/or the types of ions to be implanted. In particular, FIGS. 4a–b illustrate the implant distributions of electrically inactive ions such as He and C in silicon carbide at multiple energies, respectively, and the combined profile ("Sum") resulting therefrom. If the dose ($D_0$) for the ion implantation step is raised to a sufficient level ("$D_{cr}$"), an amorphous layer will form at the peak of the implanted profile.

Figure 5:
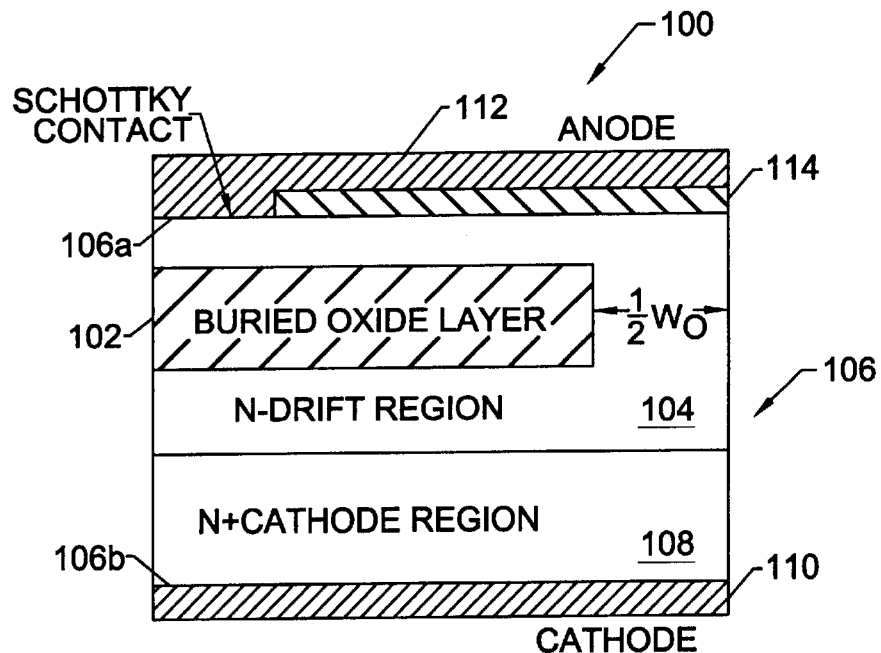
FIG. 5 is a cross-sectional view of a preferred Schottky rectifier having a buried oxide layer therein.

Referring now to FIG. 5, a preferred Schottky rectifier 100 will be described that utilizes a buried electrically insulating layer 102 to enhance the breakdown voltage characteristics of the rectifier. The buried electrically insulating layer 102 may comprise a material such as silicon dioxide (as shown), silicon nitride, calcium fluoride or other suitable dielectric material, and may be formed using conventional SIMOX techniques. The buried electrically insulating layer 102 may also be formed by patterning an electrically insulating layer on a surface of a semiconductor substrate and then using epitaxial lateral overgrowth (ELO) techniques to grow an active layer on an upper surface of the patterned electrically insulating layer. When viewed as a half unit cell, the buried electrically insulating layer 102 is surrounded on three sides by a semiconductor drift region 104 of first conductivity type (e.g., N-type) that extends to a first face 106a of a semiconductor substrate 106. However, in a highly integrated Schottky rectifier device comprising a plurality of unit cells, the buried electrically insulating layer 102 can be formed as a laterally extending layer having a plurality of openings therein, with each opening having a width "$W_o$" when viewed in transverse cross-section. A relatively highly doped cathode region 108 of first conductivity type is also provided in the semiconductor substrate 106. The cathode region 108 may extend between the drift region 104 and a second face 106b of the substrate 106. The cathode region 108 also forms a non-rectifying junction with the drift region 104 and a cathode electrode 110 may be provided on the second face 106b, as illustrated.

An electrically insulating surface layer 114 may also be patterned on the first face 106a of the substrate 106, using conventional techniques. The electrically insulating surface layer 114 is preferably patterned to expose a portion of the first face 106a that extends opposite the buried electrically insulating layer 102. An anode electrode 112 is also formed on the exposed portion of the first face 106a. This anode electrode 112 forms a Schottky rectifying junction with a portion of the drift region 104 that extends between the buried electrically insulating layer 102 and the first face 106a. The anode electrode 112 may also extend onto an upper surface of the patterned electrically insulating surface layer 114, as illustrated, in order to reduce electric field crowding at the edges of the Schottky contact and at the corners of the buried electrically insulating layer 102 that define each opening therein.

As determined by the inventor herein, the buried electrically insulating layer 102 can be used advantageously to support relatively high reverse bias voltages that exceed predicted parallel-plane breakdown voltage levels for an ideal parallel-plane Schottky rectifier having an equivalently doped drift region. Moreover, to further enhance the breakdown characteristics of the illustrated Schottky rectifier 100 and achieve relatively low specific on-state resistance, the majority carrier doping concentration in the drift region ($N_d$) is preferably set at a level that generates a lateral first conductivity type charge density of between $1\times10^{12}$ cm$^{-2}$ and $5\times10^{13}$ cm$^{-2}$ in each opening. In other words, $N_d$ and $W_o$ are preferably set at levels which satisfy the following relationship: $1\times10^{12}$ cm$^{-2}$ $\leq N_d W_o \leq 5\times10^{13}$ cm$^{-2}$.

Two dimensional simulations were also performed for a silicon Schottky rectifier 100 having the half unit cell structure of FIG. 5. In this rectifier, a relatively high N-type silicon drift region doping concentration of $1\times10^{17}$ cm$^{-3}$ was selected. The thickness of the drift region 104 was also set at 0.7 μm and the buried electrically insulating layer 102 had a thickness of 0.3 μm and was located at a depth between 0.2 μm and 0.5 μm relative to the first face 106a. A unit cell pitch of 4 μm was also chosen and the opening width $W_o$ in the buried electrically insulating layer 102 was set at 2 μm. Accordingly, a lateral charge density of $2\times10^{13}$ cm$^{-2}$ was achieved in the opening.

The reverse blocking characteristics were first obtained by application of a positive bias to the cathode. Based on the above parameters, a breakdown voltage of about 25 volts was achieved and the reverse leakage current prior to breakdown increased only slightly with increases in reverse bias. As a comparison, the reverse breakdown voltages for an ideal planar Schottky rectifier and an ideal planar P-N junction (having the same drift region doping concentrations) were 13 volts and 12 volts, respectively. Moreover, in comparison with the planar Schottky rectifier, the simulated device 100 had a leakage current at small reverse biases (below 2 volts) that was four (4) times lower (due to the reduce Schottky contact area), and more than ten (10) times lower at a reverse bias of 10 volts. Examination of the potential contours and electric fields in the device 100 (when supporting a reverse bias of 20 volts) revealed that the reverse bias is shared between the portion of the drift region 104 immediately underneath the Schottky contact and the buried electrically insulating layer 102. Thus, the Schottky contact need not support the entire reverse voltage as is the case with a conventional planar device. The simulated on-state characteristics of the device 100 were obtained by applying a negative bias to the cathode 110. It was determined that a slightly higher on-state voltage drop (when compared with a planar Schottky rectifier having a similarly doped drift region) was a result of the smaller Schottky contact area and longer forward current flow path which includes a lateral path across the buried electrically insulating layer 102. Nonetheless, a higher on-state voltage drop (and higher specific on-state resistance) will actually be experienced by a planar Schottky rectifier having the same breakdown voltage as the device 100 of FIG. 5, since a considerably lower drift region doping concentration (and thicker drift region) will be required to support the additional voltage.

Figure 6:
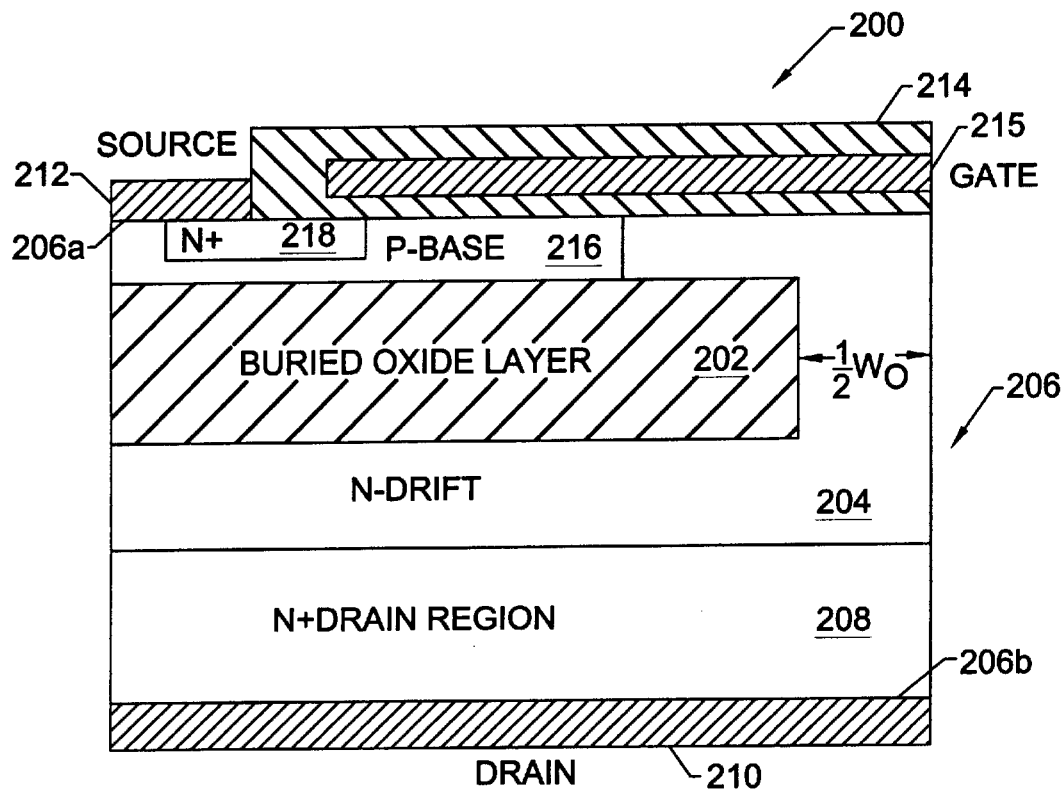
FIG. 6 is a cross-sectional view of a preferred insulated-gate field effect transistor having a buried oxide layer therein.

Referring now to FIG. 6, a preferred insulated-gate field effect transistor 200 (IGFET) will be described that utilizes a buried electrically insulating layer 202 to enhance breakdown voltage. When viewed as a half unit cell, the buried electrically insulating layer 102 is surrounded on three sides by a semiconductor drift region 204 of first conductivity type (e.g., N-type) that extends to a first face 206a of a semiconductor substrate 206. However, in an integrated IGFET comprising a plurality of unit cells, the buried electrically insulating layer 202 can be formed as a laterally extending layer having a plurality of openings therein, with each opening having a width "$W_o$" when viewed in transverse cross-section. A relatively highly doped drain region 208 of first conductivity type is also provided in the semiconductor substrate 206. The drain region 208 may extend between the drift region 204 and a second face 206b of the substrate 206. The drain region 208 also forms a non-rectifying junction with the drift region 204 and a drain electrode 210 may be provided on the second face 206b, as illustrated.

An insulated gate electrode may also be defined to extend laterally across the first face 206a of the substrate 206. As will be understood by those skilled in the art, the insulated gate electrode may comprise a gate region 215 (e.g., doped polysilicon region) that is surrounding by a gate insulating region 214 (e.g., gate oxide). A base region 216 of second conductivity type (e.g., P-type) is also provided in the drift region 204. As illustrated, the base region 216 extends between the buried electrically insulating layer 202 and the first face 206a. A relatively highly doped source region 218 (shown as N+) is also provided in the base region 216 and forms a P-N rectifying junction therewith. The source electrode 212, which is provided on the first face 206a, forms ohmic contacts to the source region 218 and base region 216.

As determined by the inventor herein, the breakdown characteristics of the illustrated IGFET 200 can be enhanced by setting the majority carrier doping concentration in the drift region ($N_d$) at a level that generates a lateral first conductivity type charge density of between $1\times10^{12}$ cm$^{-2}$ and $5\times10^{13}$ cm$^{-2}$ in each opening (i.e., $1\times10^{12}$ cm$^{-2} \leq N_d W_o \leq 5\times10^{13}$ cm$^{-2}$). Two dimensional simulations were also performed for a silicon IGFET 200 having the half unit cell structure of FIG. 6. In this device, a relatively high N-type silicon drift region doping concentration of $1\times10^{17}$ cm$^{-3}$ was selected. The thickness of the drift region 204 was also set at 0.7 μm and the buried electrically insulating layer 202 had a thickness of 0.3 μm and was located at a depth between 0.2 μm and 0.5 μm relative to the first face 206a. A unit cell pitch of 2.5 μm was also chosen and the opening width $W_o$ in the buried electrically insulating layer 202 was set at 0.5 μm. Accordingly, a lateral charge density of $5\times10^{12}$ cm$^{-2}$ was achieved in the opening. The thickness of the gate insulating region 214 was also set at 0.025 μm.

The reverse blocking characteristics were first obtained by application of a positive bias to the drain electrode 210 with a zero bias applied to the gate region 215. Based on the above parameters, the IGFET 200 was shown to be capable of supporting 20 volts and the reverse leakage current prior to breakdown increased only slightly with increases in reverse bias. Examination of the potential contours and electric fields in the device 200 (when supporting a reverse bias of 20 volts) revealed that the applied drain bias is supported entirely across the buried electrically insulating layer 202 in the region beneath the source region 218. This inhibits the reach-through related increase in leakage current observed in conventional planar IGFETs. Examination of the potential contours also revealed that very little potential penetration occurs laterally across the portion of the base region 216 in which the channel region is formed. This reduction in potential penetration allows the use of much narrower channel lengths when compared with convention IGFETs and the concomitant reduction in specific on-state resistance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor switching device, comprising:

a semiconductor substrate having a face thereon;

a buried electrically insulating layer extending laterally in said semiconductor substrate and having an opening therein; and a drift region of first conductivity type in said semiconductor substrate, said drift region extending through the opening in said buried electrically insulating layer and having a first conductivity type doping concentration therein that is established at a level sufficient to generate a first conductivity type charge density of between $1\times10^{12}$ cm$^{-2}$ and $5\times10^{13}$ cm$^{-2}$ across the opening.

2. The device of claim 1, further comprising:

a base region of second conductivity type disposed between said buried electrically insulating layer and the face and forming a P-N rectifying junction with said drift region; and a source region of first conductivity type in said base region and forming a P-N rectifying junction therewith.

3. The device of claim 2, further comprising;

a source electrode on the face, ohmically contacting said base region and said source region; and an insulated gate electrode on the face.

4. The device of claim 3, wherein said buried electrically insulating layer extends opposite said insulated gate electrode; and wherein a portion of said drift region extends between said insulated gate electrode and said buried electrically insulating layer.

5. The device of claim 1, further comprising:

an anode electrode on said semiconductor substrate, said anode electrode forming a Schottky rectifying junction with said drift region.

6. The device of claim 5, wherein said drift region extends between said buried electrically insulating layer and the face; and wherein said anode electrode extends opposite said buried electrically insulating layer.

7. The device of claim 6, further comprising a dielectric layer on the face, opposite the opening.

8. The device of claim 7, wherein said anode electrode extends opposite the opening; and wherein said dielectric layer is disposed between a portion of said anode electrode and the opening.

9. The device of claim 1, wherein a portion of said drift region that extends through the opening is uniformly doped.

10. The device of claim 1, wherein said buried electrically insulating layer comprises a SIMOX layer.

11. The device of claim 3, wherein said insulated gate electrode extends opposite the opening in said buried electrically insulating layer.

* * * * *

UNITED STATES PATENT AND TRADEMARK OFFICE
CERTIFICATE OF CORRECTION

PATENT NO. : 6,075,259  
APPLICATION NO. : 09/352392  
DATED : June 13, 2000  
INVENTOR(S) : Bantval Jayant Baliga Page 1 of 1

It is certified that error appears in the above-identified patent and that said Letters Patent is hereby corrected as shown below:

In Face page, field (56), under "References Cited - U.S. PATENT DOCUMENTS" insert the following:

| | | | |
|---|---|---|---|
| -- 4,071,945 | 2/1978 | Karatsjuka et al. | 29/578 |
| 4,654,958 | 4/1987 | Baerg et al. | 29/571 |
| 4,717,677 | 1/1988 | McLaughlin et al. | 437/24 |
| 4,805,003 | 2/1989 | Holm et al. | 357/22 |
| 4,908,328 | 3/1990 | Hu et al. | 437/63 |
| 5,077,589 | 12/1991 | Holm et al. | 357/23.4 |
| 5,793,064 | 8/1998 | Li | 257/119 |
| 5,795,800 | 8/1998 | Chan et al. | 438/149 |
| 5,917,204 | 6/1999 | Bhatnagar et al. | 257/142 -- |

Signed and Sealed this  
Sixth Day of December, 2011

David J. Kappos  
*Director of the United States Patent and Trademark Office*